United States Patent [19]

Tarumoto et al.

[11] Patent Number: 5,556,724
[45] Date of Patent: Sep. 17, 1996

[54] PHASE SHIFT PHOTOMASK AND METHOD OF PRODUCING SAME

[75] Inventors: Norihiro Tarumoto; Hiroyuki Inomata; Takashi Tominaga, all of Tokyo-To, Japan

[73] Assignee: Dai Nippon Printing Co., Ltd., Japan

[21] Appl. No.: 149,220

[22] Filed: Nov. 9, 1993

[30] Foreign Application Priority Data

Nov. 10, 1992 [JP] Japan ................................ 4-324764
Dec. 3, 1992 [JP] Japan ................................ 4-349982

[51] Int. Cl.$^6$ ...................................................... G03F 9/00
[52] U.S. Cl. ........................ 430/5; 430/311; 430/320; 428/78; 428/203; 428/209; 428/210
[58] Field of Search ........................... 430/5, 311, 320; 428/210, 203, 209, 78

[56] References Cited

U.S. PATENT DOCUMENTS 4,363,846  12/1982  Kaneki ........................ 428/333
5,202,204  4/1993  Kawahira et al. ............ 430/5
5,318,868  6/1994  Hasegawa et al. ............ 430/5

*Primary Examiner*—S. Rosasco
*Attorney, Agent, or Firm*—Parkhurst, Wendel & Burr, L.L.P.

[57] ABSTRACT

A phase shift photomask is produced in the following manner. Before or after a light-shielding pattern is formed on a substrate, a transparent film serving as a phase shifter is coated onto the substrate, and the transparent film in a photomask-pattern-forming area exluding the peripheral area of the substrate is irradiated with energy rays. The irradiated portion of the transparent film is thus solidified. The unsolidified portion of the transparent film is removed by etching. A phase shifter pattern is thus formed on the substrate excluding the peripheral area of the substrate. Since the phase shifter pattern is not exposed at the peripheral area of the substrate, a dust which is usually made when the phase shifter pattern formed in this area cracks or peels off the substrate is not made. The number of defective photomasks to be produced can thus be reduced.

14 Claims, 9 Drawing Sheets

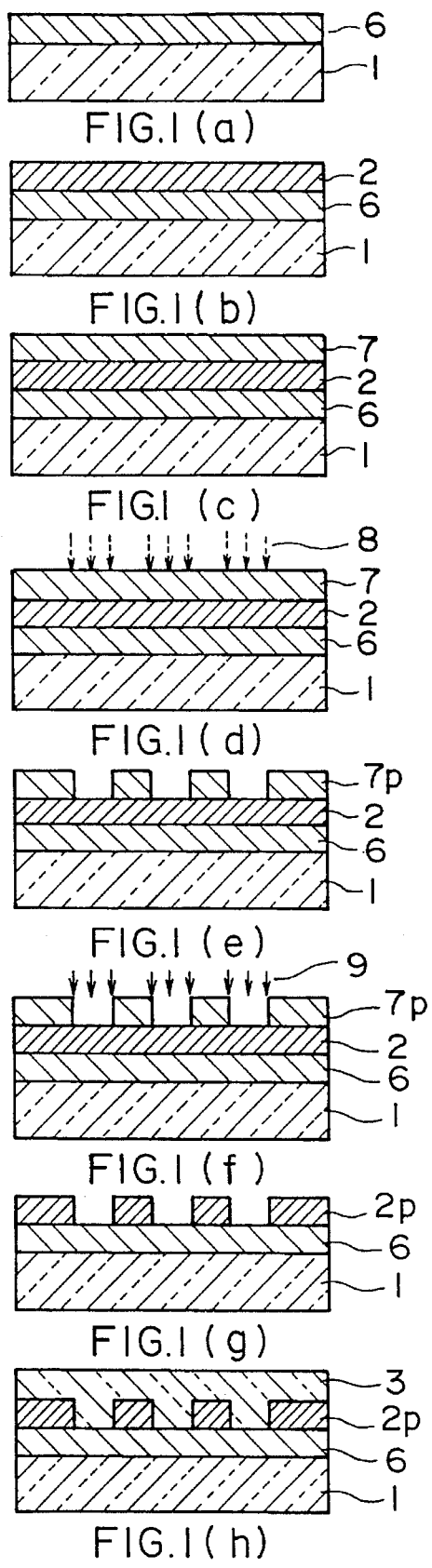
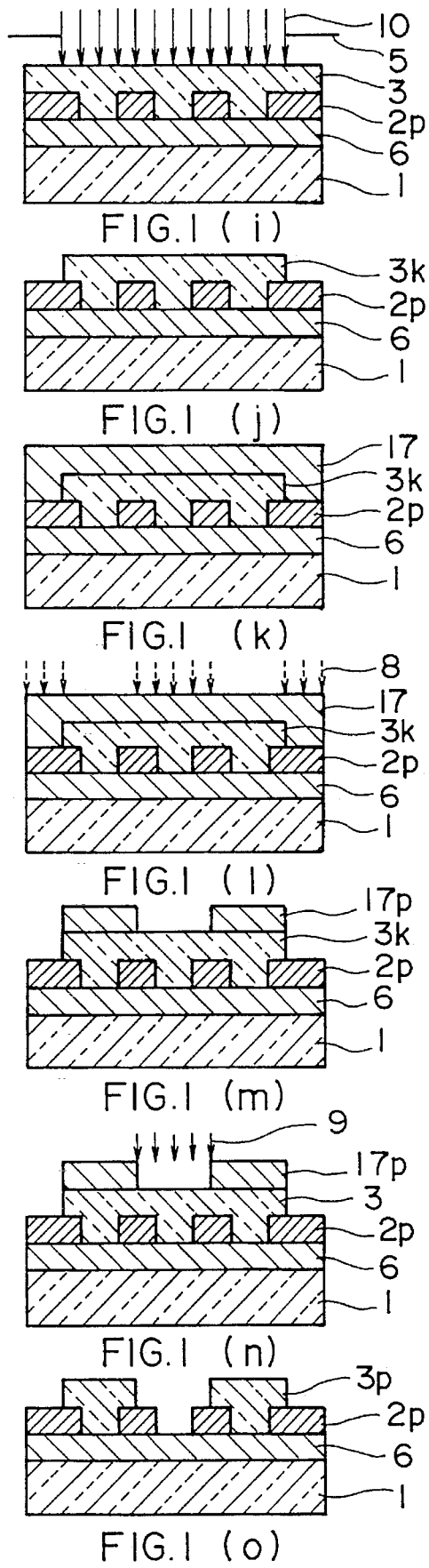

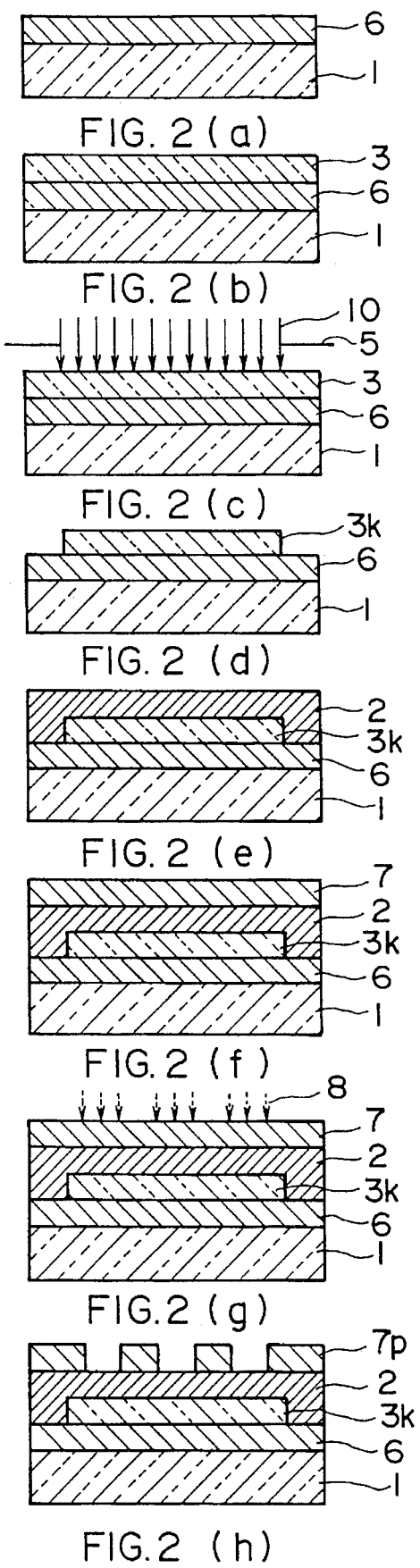
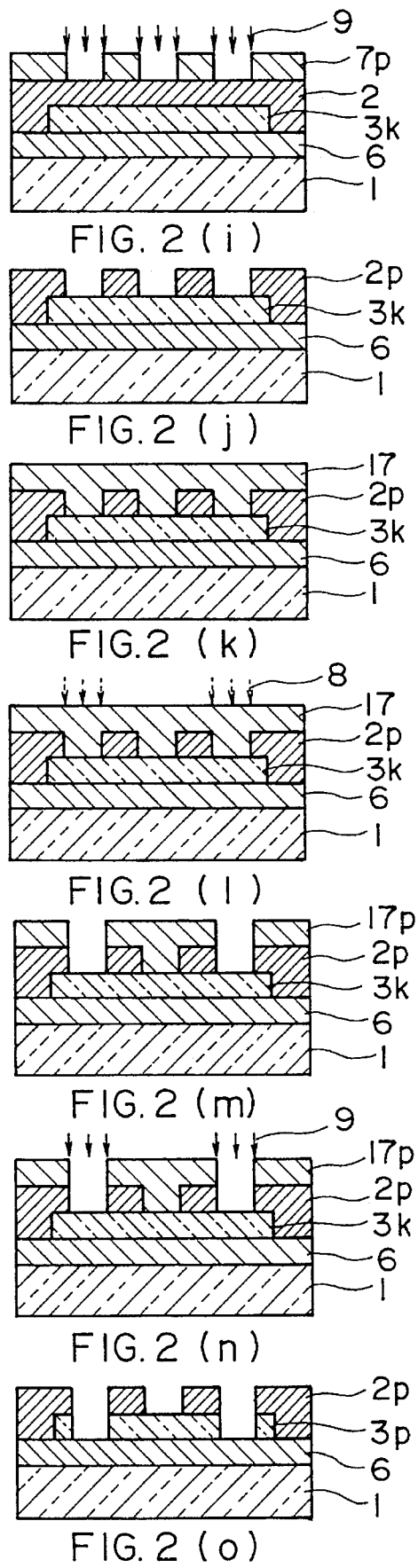

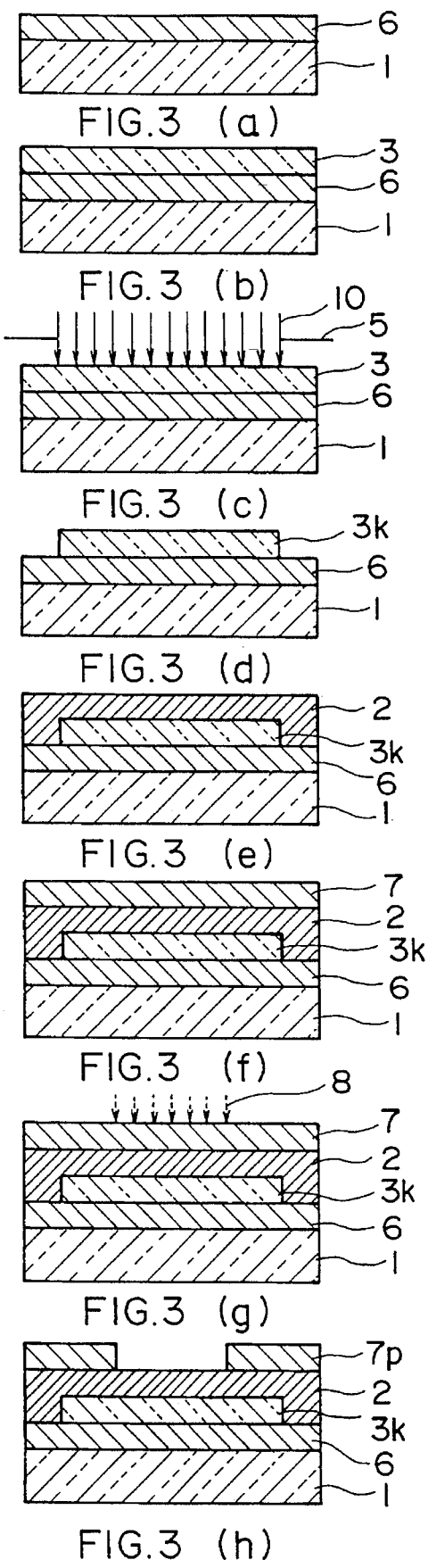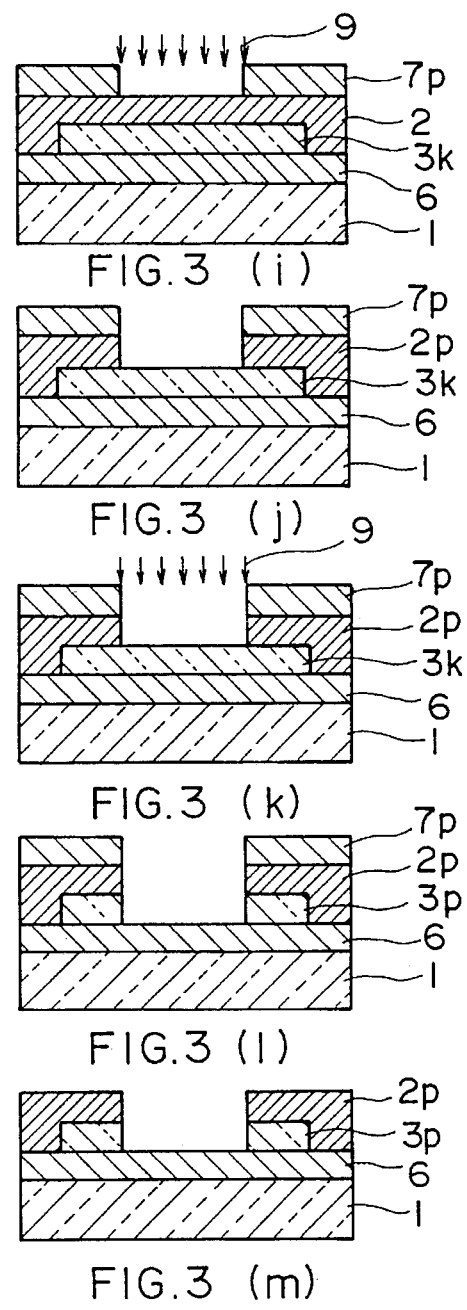

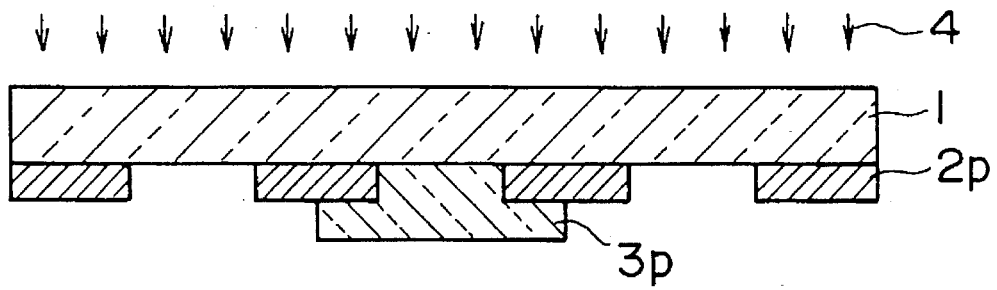
FIG.5 (a) PRIOR ART
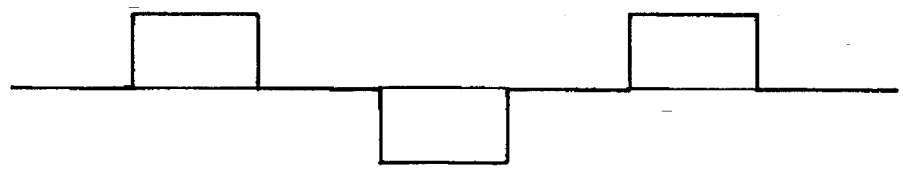
FIG.5 (b) PRIOR ART
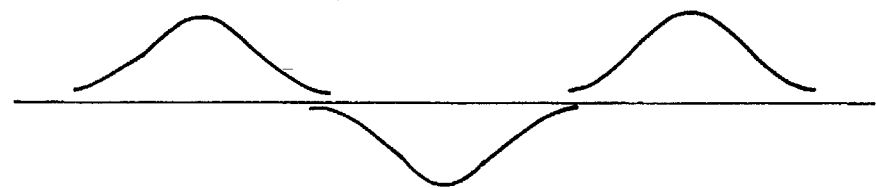
FIG.5 (c) PRIOR ART
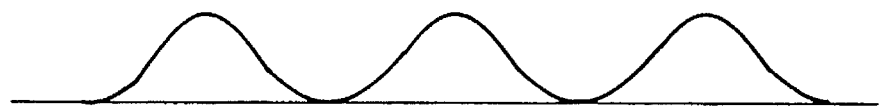
FIG.5 (d) PRIOR ART

PHASE SHIFT PHOTOMASK AND METHOD OF PRODUCING SAME

BACKGROUND OF THE INVENTION

The present invention relates to a photomask which is used for the fabrication of integrated circuits with extremely high density such as VLSI and ULSI, and a method for producing the same. Particularly, the present invention relates to a phase shift photomask having a transparent film which serves as a phase shifter useful for creating minute patterns with high density, and a method for producing the same.

Semiconductor integrated circuits such as IC, LSI and VLSI are conventionally produced by repeating the so-called lithographic process in which after a resist layer is coated onto a substrate such as a Si wafer and then exposed image-wise to light by a stepper or the like, development and etching are conducted to obtain a desired resist pattern.

As semiconductor integrated circuits become more complicated and have higher integration, a photomask called a reticle, used in the above lithographic process tends to have higher density.

It is demanded that the line width of a device pattern created by using such a reticle be narrower: for instance, a line width of 1.2 µm for 1 Mbit DRAM, 0.8 µm for 4 Mbit DRAM, and 0.5 µm for 16 Mbit DRAM. In order to respond to such a demand, various exposure methods are now being studied.

For example, a pattern having a line width of 0.35 µm is necessary for a device of a 64 Mbit DRAM class. In a conventional stepper exposure method using a reticle, this line width is a resolution limit of a resist pattern. In order to overcome this limit, phase shift lithography using a phase shift reticle has been proposed as shown, for instance, in Japanese Laid-Open Patent Publication No. 173744/1983 and Japanese Patent Publication No. 59296/1987. As will be described later in detail, this is a technique of improving the contrast and resolving power of a projected image by controlling the phase shift of light which passes through a reticle.

The phase shift photomasks are classified into some types such as of the alternating type with a shifter placed at the upper part thereof, the alternating type with a shifter placed at the lower part thereof, and the attenuated type as described later. However, the production of any of the above photomasks comprises the step of forming a transparent film serving as a phase shifter at any proper position in the layers needed for a phase shift photomask formed on a substrate.

One of the methods for forming this transparent film serving as a phase shifter is as follows: SOG (Spin-On-Glass) (an application-type $SiO_2$ coating layer) is dropped on the upper surface of a substrate, spread over the entire rectangular surface of the substrate by rotating the substrate at high speed, utilizing the centrifugal force which acts on the SOG, and then dried by evaporating any solvent contained therein.

In the above process, the SOG protuberates at the periphery of the substrate because the boundary conditions are different. Such a protuberance cracks or peels off the substrate when baked, so that it is the source of dust in the production of a photomask.

There is also a case where a sputtering method is employed for forming the transparent film serving as a phase shifter. In this case, the transparent film serving as a phase shifter is formed even in a chamferred area, the peripheral area of a substrate. The chamferred surface and periphery of the substrate have fine micro-cracks which are produced during a chamfering process, so that the adhesion of the transparent film to the substrate in the peripheral area is weaker than that to the substrate in the central area. For this reason, there is a phenomenon that the transparent film formed in the peripheral area peels off the substrate as fine particles during the production of a photomask or the use thereof.

In general, therefore, the manner in which SOG in the peripheral area of a substrate is wiped out, before SOG is baked, with a cloth or the like infiltrated with an organic solvent has been adopted in the SOG-coating method; and the manner in which hydrofluoric acid or an aqueous strong alkaline solution is used for the removal of SOG in the peripheral area of a substrate has been adopted after SOG is baked in the SOG-coating method, or in the SOG-sputtering method.

However, there are the following problems with the conventional manners for removing a material for the transparent film serving as a phase shifter at its peripheral portion. In the manner in which the material for a shifter at its peripheral portion is wiped out with a cloth infiltrated with an organic solvent, photomasks are wiped one by one, so that fine particles of the material for a shifter are deposited to the substrate unless the condition of the cloth is strictly handled. Thus, this manner causes many problems on the quality and handling.

Further, regarding the manner in which the material for a shifter at its peripheral portion is removed by using hydrofluoric acid or an aqueous strong alkaline solution, these chemicals are poisons as are commonly known, so that they are inconvenient in handling. Moreover, in this manner, the peripheral area of a substrate to be treated is dipped in hydrofluoric acid or an aqueous strong alkaline solution. Therefore, the portion of the transparent film serving as a phase shifter to be removed cannot be stably controlled due to the rise of the aqueous solution to a level higher than the dipped surface of the substrate, rippling of the surface of the aqueous solution, deterioration of the solution, or the like.

SUMMARY OF THE INVENTION

An object of the present invention is to solve the above-described drawbacks, thereby obtaining a phase shift photomask which is advantageous over the conventional ones in that only the effective part of a transparent film serving as a phase shifter is stably formed, that it is free from deposition of foreign matters or dusts and thus excellent in quality, and that it can be safely produced without using a poison.

Another object of the present invention is to provide a method for producing the above-described phase shift photomask.

A phase shift photomask of the present invention is characterized by comprising a substrate, a light-shielding pattern formed on the surface of the substrate, and a phase shifter pattern formed on the substrate, wherein the phase shifter pattern is not provided in the peripheral area of the substrate.

A method for producing a phase shift photomask according to the present invention is characterized by comprising the steps of coating a transparent film serving as a phase shifter onto a substrate; solidifying the transparent film in a photomask-pattern-forming area excluding the peripheral area of the substrate, while leaving the transparent film in the area excluding the photomask-pattern-forming area unsolidified; and removing the unsolidified transparent film by etching in order to leave the solidified transparent film only in the photomask-pattern-forming area.

Another method for producing a phase shift photomask according to the present invention is characterized by comprising the steps of forming a resist layer on a substrate; leaving the resist layer only in the peripheral area of the substrate; providing a transparent film serving as a phase shifter on both the remaining resist layer and the surface of the substrate; and removing the remaining resist layer together with the transparent film formed thereon by acting a solvent on the remaining resist layer in order to leave the transparent film only in a photomask-pattern-forming area excluding the peripheral area of the substrate.

BRIEF DESCRIPTION OF THE DRAWINGS

FIG. 1(a) to FIG. 1(o) are cross-sectional views showing, in consecutive order, the stages in the production of an alternating type phase shift photomask with a shifter placed at the upper part thereof according to the present invention;

FIG. 2(a) to FIG. 2(o) are cross-sectional views showing, in consecutive order, the stages in the production of an alternating type phase shift photomask with a shifter placed at the lower part thereof according to the present invention;

FIG. 3(a) to FIG. 3(m) are cross-sectional views showing, in consecutive order, the stages in the production of an attenuated type phase shift photomask according to the present invention;

FIG. 5(a) to FIG. 5(d) are illustrations explaining the principle of a phase shift photomask;

DESCRIPTION OF THE PREFERRED EMBODIMENTS

Prior to the detailed description of the present invention, phase shift layer lithography is explained by referring to the accompanied drawings so that the present invention can be easily understood. FIG. 5(a) to FIG. 5(d) are illustrations given to explain the principle of a phase shift photomask, and FIG. 6(a) to FIG. 6(d) are illustrations given to explain the principle of a conventional photomask.

Figure 4:
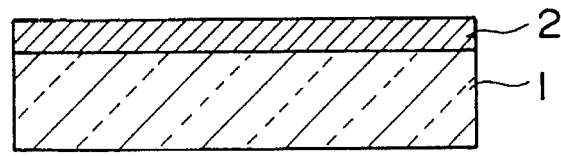
FIG. 4(a) to FIG. 4(f) are cross-sectional views showing, in consecutive order, the stages in the production of a phase shift photomask blank according to the present invention.
Figure 4:
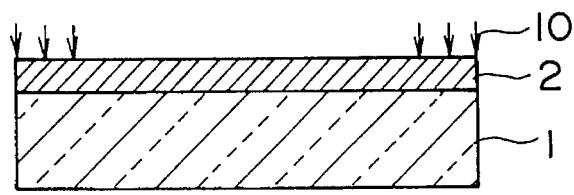
Figure 4:
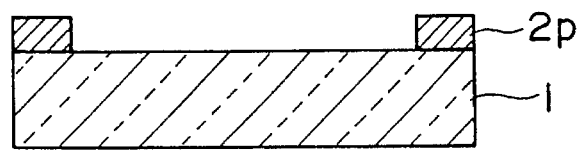
Figure 4:
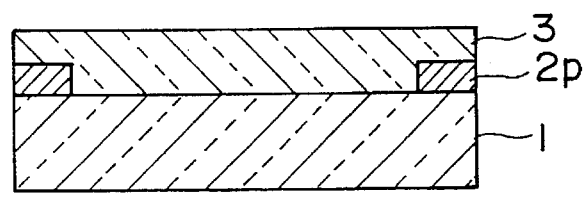
Figure 4:
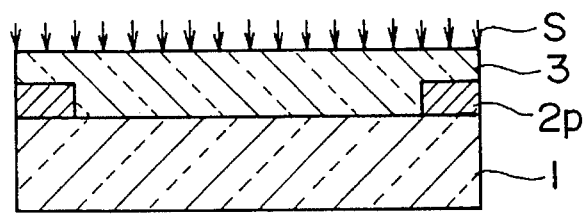
Figure 4:
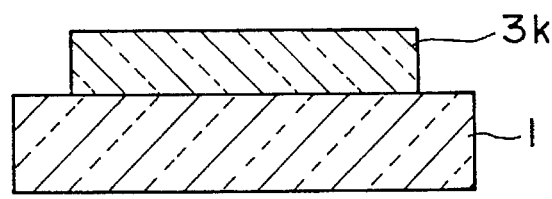
Figure 6A:
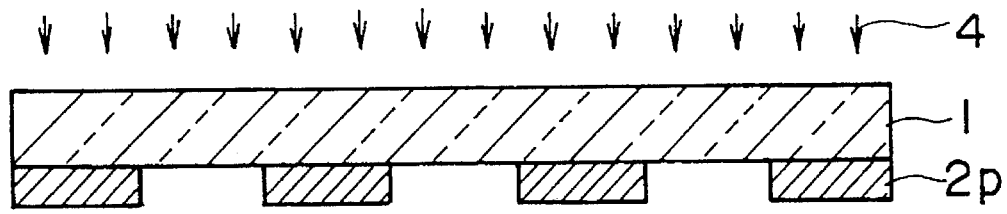
FIG. 6(a) to FIG. 6(d) are illustrations explaining the principle of a conventional photomask.
Figure 6B:
Figure 6C:
Figure 6D:

FIG. 5(a) and FIG. 6(a) are cross-sectional views of reticles, each of FIG. 5(b) and FIG. 6(b) shows the amplitude of light on the reticle, each of FIG. 5(c) and FIG. 6(c) shows the amplitude of light on a wafer, and each of FIG. 5(d) and FIG. 6(d) shows the intensity of light on the wafer. Further, in the figures, the numeral 1 indicates a transparent substrate made of quartz or the like (hereinafter referred to as a substrate), the numeral 2 indicates a light-shielding layer made of chromium or the like (hereinafter referred to as a light-shielding layer), the numeral 2p indicates a light-shielding pattern, the numeral 3 indicates a transparent film serving as a phase shifter, the numeral 3p indicates a phase shifter pattern, and the numeral 4 indicates incident light.

In the conventional method, a light-shielding layer 2p is formed on a substrate 1, and light-transmitting portions which constitute a desired pattern are thus simply formed on the substrate as shown in FIG. 6(a). On the other hand, in phase shift lithography, a phase shifter pattern 3p made of a light-transmitting film is provided on some of the light-transmitting portions adjacently formed on the reticle, as shown in FIG. 5(a), in order to invert phases with a phase difference of 180 degrees. In the conventional method, the amplitude of light on the reticle has phases having no phase difference as shown in FIG. 6(b), and the amplitude of light on the wafer is also as shown in FIG. 6(c). Thus, a pattern formed on the wafer cannot be separated. On the contrary, in the phase shift method in which the phase shifter pattern 3p is provided on some of the light-transmitting portions adjacently formed, the amplitude of light on the reticle has phases which are made reverse to each other between the adjacent patterns as shown in FIG. 5(b), so that the amplitude of light on the wafer also has reverse phases as shown in FIG. 5(c). For this reason, the intensity of light at the boundary region between the patterns on the wafer becomes zero, and the adjacent patterns can thus be clearly separated as shown in FIG. 5(d). As described above, by the phase shift lithography, it is possible to separate even those patterns which cannot be separated by the conventional method, and the resolution can thus be improved.

Figure 7A:
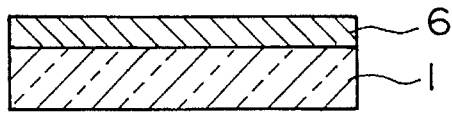
FIG. 7(a) to FIG. 7(m) are cross-sectional views showing, in consecutive order, the stages in the production of a conventional alternating type phase shift photomask with a shifter placed at the upper part thereof.
Figure 7B:
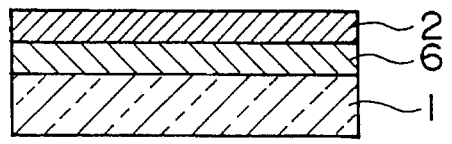
Figure 7C:
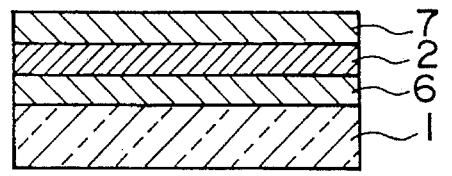
Figure 7D:
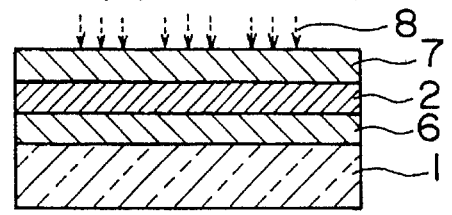
Figure 7E:
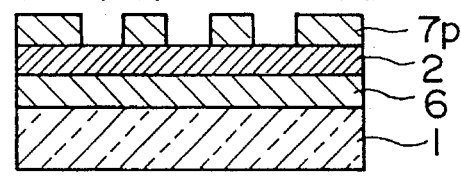

One example of the process for producing a phase shift photomask is explained by referring to FIG. 7(a) to FIG. 7(m). These figures are cross-sectional views showing the stages in the production of an alternating type phase shift photomask with a shifter placed at the upper part thereof. As shown in FIG. 7(a), an etching stopper layer 6 made of aluminum or the like is formed on a substrate 1, and then a light-shielding layer 2 is formed thereon as shown in FIG. 7(b). As shown in FIG. 7(c), a resist layer 7 is provided on the light-shielding layer 2, and, as shown in FIG. 7(d), the resist layer 7 is exposed image-wise to light 8 through a mask by a conventional manner, and then developed and rinsed to form a desired resist pattern 7p as shown in FIG. 7(e).

Figure 7F:
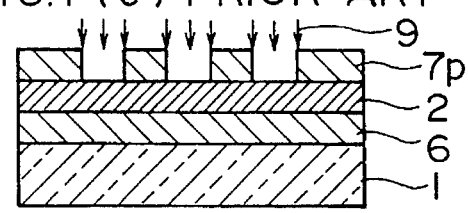
Figure 7G:
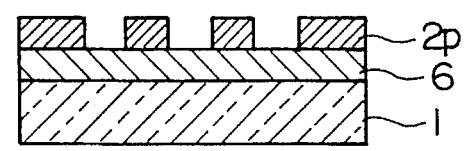

After heat and descum treatments are conducted when necessary, the light-shielding layer 2 which is exposed at the openings in the resist pattern 7p is dry-etched by etching gas plasma 9 as shown in FIG. 7(f). Mixed gas of $CCl_4+O_2$, $CH_2Cl_2+O_2$, or the like is used as the etching gas (etching gas plasma of the same materials is used also for the etching of the below-described light-shielding layers). The remaining resist is then removed to form a light-shielding pattern 2p as shown in FIG. 7(g). The light-shielding pattern 2p can also be formed by a wet etching method instead of the dry etching method using the etching gas plasma 9 (a wet method is employable instead of the dry method also in the below-described etching processes using etching gas plasma).

Figure 7H:
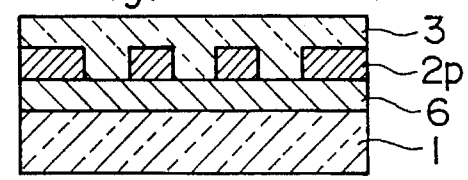
Figure 7I:
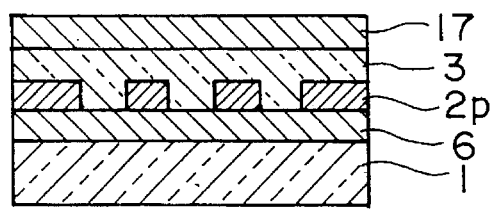
Figure 7J:
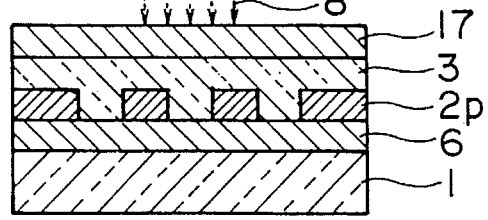
Figure 7K:
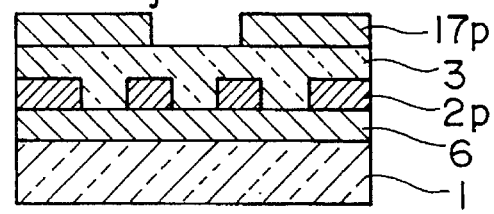

Next, spin-on glass or the like is spin-coated onto the light-shielding pattern 2p, and then baked to form a transparent film 3 serving as a phase shifter as shown in FIG. 7(h). A resist layer 17 is formed on the transparent film 3 serving as a phase shifter as shown in FIG. 7(i), and subjected to alignment in accordance with a conventional manner. The resist layer 17 is exposed image-wise to ionizing radiation 8 by using an electron beam exposure apparatus or the like as shown in FIG. 7(j), and then developed and rinsed to form a desired resist pattern 17p as shown in FIG. 7(k).

Figure 7L:
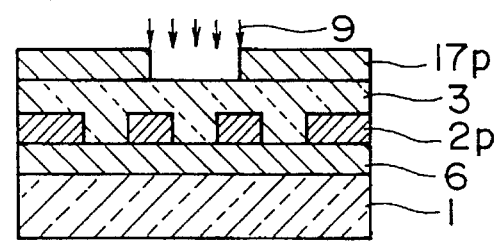
Figure 7M:
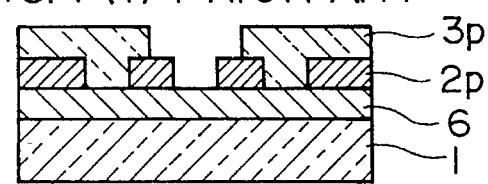

After heat and descum treatments are conducted when necessary, the transparent film 3 serving as a phase shifter which is exposed at the openings in the resist pattern 17p is dry-etched by using etching gas plasma 9 as shown in FIG. 7(l). The remaining resist is then removed to form a phase shifter pattern 3p as shown in FIG. 7(m). An alternating type phase shift photomask with a shifter provided at the upper part thereof is thus completed. $CF_4$, $C_2F_6$, $CHF_3$, $CHF_3+O_2$, or a mixture thereof is used as the etching gas (etching gas plasma of the same materials is used also for the etching of the below-described transparent films serving as a phase shifter).

Beside the above-described phase shift photomask with a shifter placed at the upper part thereof, that is, the phase shifter pattern 3p is placed on the light-shielding pattern 2p, a phase shift photomask with a shifter placed at the lower part thereof, that is, the phase shifter pattern 3p is placed under the light-shielding pattern 2p has also been proposed. The mask of this type is advantageous in that the transparent film 3 serving as a phase shifter can be formed on the flat surface of a substrate, so that the unevenness of the phase shifter pattern 3p on the photomask surface can be minimized.

Figure 8A:
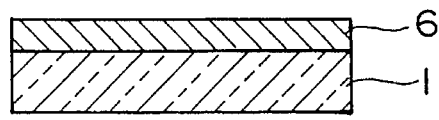
FIG. 8(a) to FIG. 8(m) are cross-sectional views showing, in consecutive order, the stages in the production of a conventional alternating type phase shift photomask with a shifter placed at the lower part thereof.
Figure 8B:
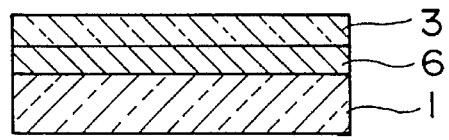
Figure 8C:
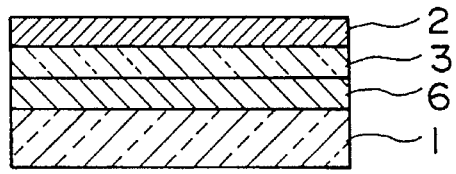
Figure 8D:
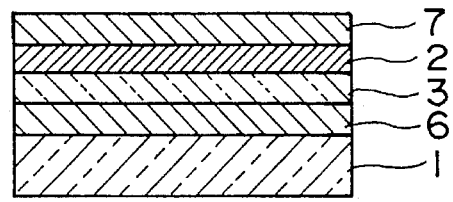
Figure 8E:
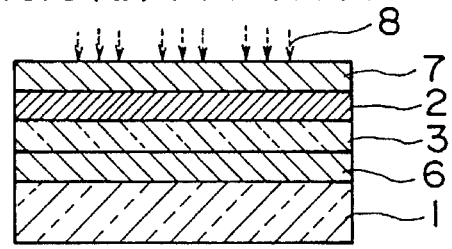
Figure 8F:
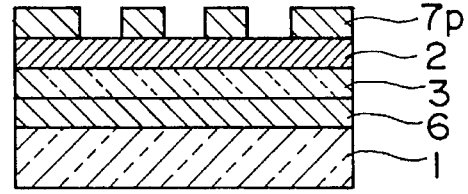

One example of the process for producing the phase shift photomask with a shifter placed at the lower part thereof is explained by referring to FIG. 8(a) to FIG. 8(m). First, an alumina layer serving as an etching stopper layer 6 is formed on a substrate 1 as shown in FIG. 8(a). Spin-on glass is spin-coated onto the etching stopper layer 6, and then baked to form a transparent film 3 serving as a phase shifter as shown in FIG. 8(b). A light-shielding layer 2 is then formed on the transparent film 3 serving as a phase shifter as shown in FIG. 8(c). A resist layer 7 is formed on the light-shielding layer 2 as shown in FIG. 8(d). The resist layer 7 is exposed image-wise to ionizing radiation 8 by using an electron beam exposure apparatus or the like as shown in FIG. 8(e), and then developed and rinsed to form a desired resist pattern 7p as shown in FIG. 8(f).

Figure 8G:
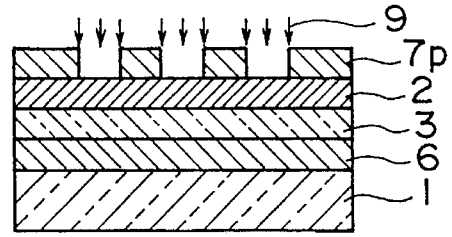
Figure 8H:
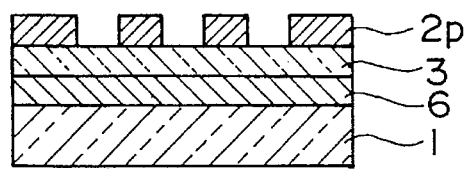

After heat and descum treatments are conducted when necessary, the light-shielding layer 2 which is exposed at the openings in the resist pattern 7p is dry-etched by using etching gas plasma 9 as shown in FIG. 8(g). The remaining resist is then removed to form a light-shielding pattern 2p as shown in FIG. 8(h).

Figure 8I:
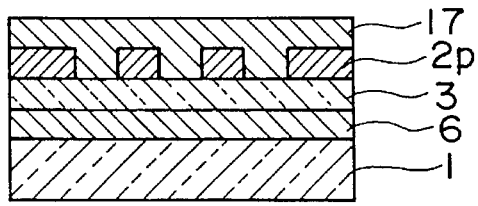
Figure 8J:
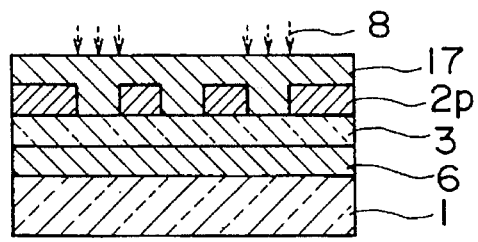
Figure 8K:
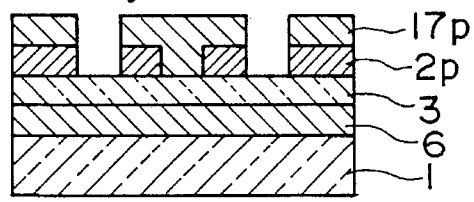

A resist layer 17 is formed on the light-shielding pattern 2p as shown in FIG. 8(i). The resist layer 17 is exposed image-wise to ionizing radiation 8 by using an electron beam exposure apparatus or the like as shown in FIG. 8(j), and then developed and rinsed to form a desired resist pattern 17p as shown in FIG. 8(k).

Figure 8L:
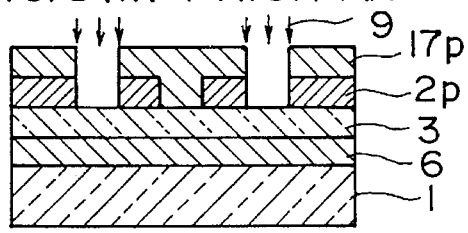
Figure 8M:
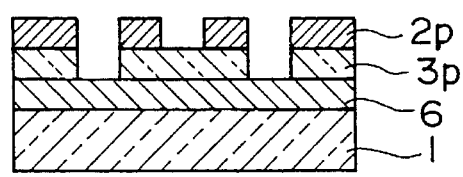

After heat and descum treatments are conducted when necessary, the transparent film 3 serving as a phase shifter which is exposed at the openings in the resist pattern 17p is dry-etched by using etching gas plasma 9 as shown in FIG. 8(l) to form a phase shifter pattern 3p Thereafter, the remaining resist is removed, whereby an alternating type phase shift photomask with a shifter placed at the lower part thereof is completed as shown in FIG. 8(m).

The two processes for producing the alternating type phase shift photomasks have been explained in the above. Beside the photomasks of these types, an attenuated type phase shift photomask in which films having an optical transmission of ten-odd percents are provided both on and under the phase shifter pattern 3p has also been proposed. The mask of this type is advantageous in that it requires less numbers of steps in its production than those in the production of the above-described alternating type photomasks.

Figure 9A:
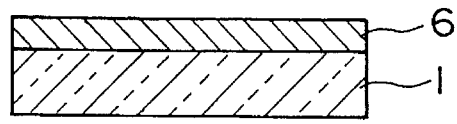
FIG. 9(a) to FIG. 9(k) are cross-sectional views showing, in consecutive order, the stages in the production of a conventional attenuated type phase shift photomask.
Figure 9B:
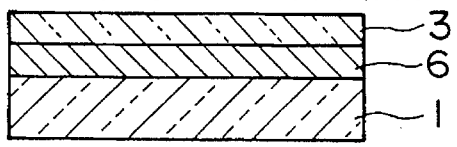
Figure 9C:
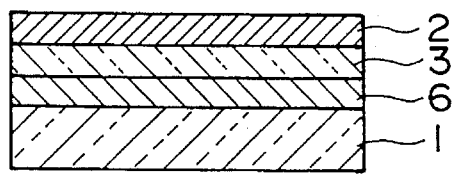
Figure 9D:
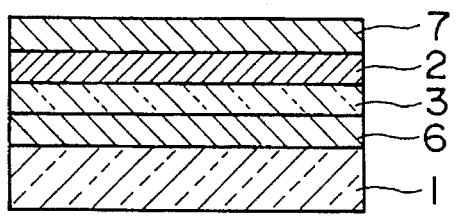
Figure 9E:
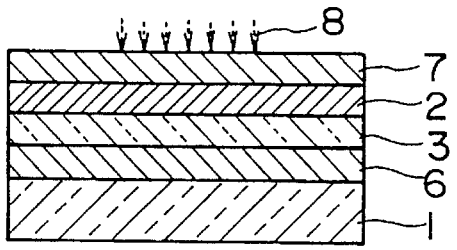
Figure 9F:
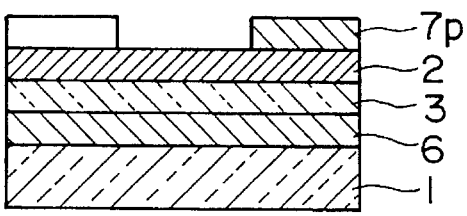

One example of the process for producing the attenuated type phase shift photomask is explained by referring to FIG. 9(a) to FIG. 9(k). At first, an alumina layer serving as an etching stopper layer 6 is formed on a substrate 1 as shown in FIG. 9(a). Spin-on glass is spin-coated onto the etching stopper layer 6, and then baked to form a transparent film 3 serving as a phase shifter as shown in FIG. 9(b). As shown in FIG. 9(c), a chromium layer which serves as a light-shielding layer 2 having an optical transmission of ten-odd percents is formed on the transparent film 3 serving as a phase shifter. A resist layer 7 is formed, as shown in FIG. 9(d), on the light-shielding layer 2. The resist layer 7 is exposed image-wise to ionizing radiation 8 by using an electron beam exposure apparatus or the like as shown in FIG. 9(e), and then developed and rinsed to form a desired resist pattern 7p as shown in FIG. 9(f).

Figure 9G:
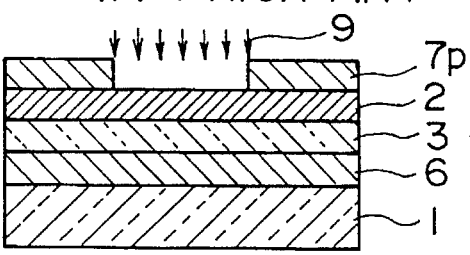
Figure 9H:
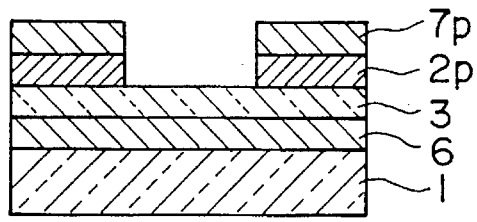
Figure 9I:
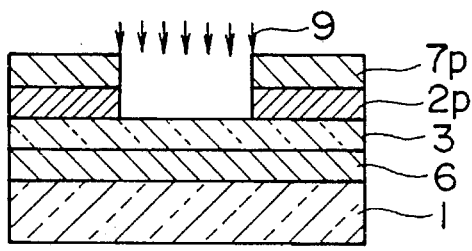
Figure 9J:
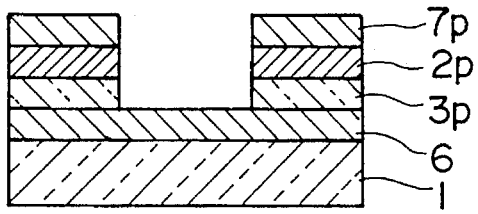
Figure 9K:
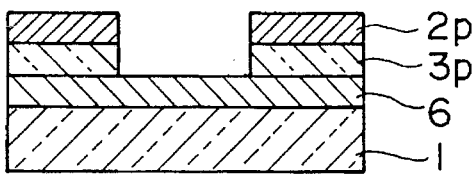

After heat and descum treatments are conducted when necessary, the light-shielding layer 2 which is exposed at the openings in the resist pattern 7p is dry-etched by using etching gas plasma 9 as shown in FIG. 9(g) to form a light-shielding pattern 2p as shown in FIG. 9(h). After heat and descum treatments are conducted when necessary, the transparent film 3 serving as a phase shifter which is exposed at the openings in the resist pattern 7p is dry-etched by using etching gas plasma 9 to form a phase shifter pattern 3p as shown in FIG. 9(i). The remaining resist is removed, whereby an attenuated type phase shift photomask is completed as shown in FIG. 9(k).

In the processes for producing the phase shift photomasks as shown in FIG. 7(a) to FIG. 7(m), FIG. 8(a) to FIG. 8(m), and FIG. 9(a) to FIG. 9(k), when a transparent film serving as a phase shifter is formed by using glass which is spin-coated onto a substrate and then baked, a transparent phase shifter pattern 3p at the outer periphery and in the peripheral area of the quartz substrate tends to peel off the substrate, making a dust and the like by which defective photomasks are produced. An object of the present invention is to solve this problem.

Examples of the present invention will now be described in detail below.

FIG. 1(a) to FIG. 1(o), FIG. 2(a) to FIG. 2(o), and FIG. 3(a) to FIG. 8(m) show, in consecutive order, the stages in the production of phase shift photomasks, in which the present invention is applied to the prior art methods as shown in FIG. 7(a) to FIG. 7(m), FIG. 8(a) to FIG. 8(m), and FIG. 9(a) to FIG. 9(k), respectively.

FIG. 1(a) to FIG. 1(o) show, as an example, in consecutive order the stages in the production of an alternating type phase shift photomask with a shifter placed at the upper part thereof according to the present invention.

An etching stopper layer 6 is formed on a substrate 1 as shown in FIG. 1(a), and a light-shielding layer 2 is formed on top of the etching stopper layer 6 as shown in FIG. 1(b). A resist layer 7 is then formed, as shown in FIG. 1(c), on the light-shielding layer 2, and subjected to alignment in accordance with a conventional manner. The resist layer 7 is exposed imagewise wise to ionizing radiation 8 by using an electron beam exposure apparatus or the like as shown in FIG. 1(d), and then developed and rinsed to form a desired resist pattern 7p as shown in FIG. 1(e).

After heat and descum treatments are conducted when necessary, the light-shielding layer 2 which is exposed at the openings in the resist pattern 7p is dry-etched by using etching gas plasma 9 as shown in FIG. 1(f). The remaining resist is then removed to form a light-shielding pattern 2p as shown in FIG. 1(g).

As shown in FIG. 1(h), transparent spin-on glass is spin-coated onto the light-shielding layer 2, and soft-baked to form a transparent film 3 serving as a phase shifter. As shown in FIG. 1(i), the outer periphery and peripheral area of the substrate 1 are masked with a light-shielding film 5, and energy rays 10 are applied through the film 5 to solidify the transparent film 3 serving as a phase shifter. The energy rays are, for example, ultraviolet rays or X-rays. Subsequently, the portion unirradiated with the energy rays 10 is etched by using an organic solvent to leave a transparent film 3k serving as a phase shifter in a pattern area excluding the outer periphery and peripheral area of the substrate 1.

A resist layer 17 is formed on the transparent film 3k serving as a phase shifter formed in the pattern area as shown in FIG. 1(k), and subjected to alignment in accordance with a conventional manner. The resist layer 17 is exposed image-wise to ionizing radiation 8 by using sn electron beam exposure apparatus or the like as shown in FIG. 1(l), and then developed and rinsed to form s desired resist pattern 17p as shown in FIG. 1(m).

After heat and descum treatments are conducted when necessary, the transparent film 3k serving as a phase shifter formed in the pattern area, exposed at the openings in the resist pattern 17p is dry-etched by using etching gas plasma 9 as shown in FIG. 1(n). The remaining resist is removed to form a phase shifter pattern 3p, whereby an alternating type phase shift photomask with a shifter placed at the upper part thereof according to the present invention is completed as shown in FIG. 1 (o).

FIG. 2(a) to FIG. 2(o) are illustrations showing, in consecutive order, the stages in the production of an alternating type phase shift photomask with a shifter placed at the lower part thereof according to the present invention. An alumina layer serving as an etching stopper layer 6 is firstly formed on a substrate 1 as shown in FIG. 2(a). As shown in FIG. 2(b), spin-on glass is spin-coated onto the etching stopper layer 6, and then soft-baked to form a transparent film 3 serving as a phase shifter. As shown in FIG. 2(c), the outer periphery and peripheral area of the substrate 1 are masked with a light-shielding film 5, and energy rays 10 are applied through the film 5 to solidify the transparent film 3 serving as a phase shifter. Subsequently, the portion unirradiated with the energy rays 10 is etched by using an organic solvent to leave a transparent film 3k serving as a phase shifter in a pattern area excluding the outer periphery and peripheral area of the substrate 1 as shown in FIG. 2(d).

A light-shielding layer 2 is formed on the transparent film 3k serving as a phase shifter formed in the pattern area as shown in FIG. 2(e). A resist layer 7 is formed on the light-shielding layer 2 as shown in FIG. 2(f). After alignment is conducted in accordance with a conventional manner, the resist layer 7 is exposed image-wise to ionizing radiation 8 by using an electron beam exposure apparatus or the like as shown in FIG. 2(g), and then developed and rinsed to form a desired resist pattern 7p as shown in FIG. 2(h).

After heat and descum treatments are conducted when necessary, the light-shielding layer 2 which is exposed at the openings in the resist pattern 7p is dry-etched by using etching gas plasma 9 as shown in FIG. 2(i), and the remaining resist is removed to form a light-shielding pattern 2p as shown in FIG. 2(j).

A resist layer 17 is formed on the light-shielding pattern 2p as shown in FIG. 2(k). The resist layer 17 is exposed image-wise to ionizing radiation 8 by using an electron beam exposure apparatus or the like as shown in FIG. 2(l), and then developed and rinsed to form a desired resist pattern 17p as shown in FIG. 2(m).

After heat and descum treatments are conducted when necessary, the transparent film 3k serving as a phase shifter formed in the pattern area, exposed at the openings in the resist pattern 17p is dry-etched by using etching gas plasma 9 to form a phase shifter pattern 3p as shown in FIG. 2(n).

The remaining resist is removed, whereby an alternating type phase shift photomask with a shifter placed at the lower part thereof according to the present invention is completed as shown in FIG. 2(o).

FIG. 3(a) to FIG. 3(m) are illustrations showing, in consecutive order, the stages in the production of an attenuated type phase shift photomask according to the present invention. An alumina layer serving as an etching stopper layer 6 is firstly formed on a substrate 1 as shown in FIG. 3(a). As shown in FIG. 3(b), spin-on glass is spin-coated onto the etching stopper layer 6, and then soft-baked to form a transparent film 3 serving as a phase shifter. As shown in FIG. 3(c), the outer periphery and peripheral area of the substrate are masked with a light-shielding film 5, and energy rays 10 are applied through the film 5 to solidify the transparent film 3 serving as a phase shifter. Subsequently, the portion unirradiated with the energy rays 10 is etched by using an organic solvent, and baked to leave a transparent film 3k serving as a phase shifter in a pattern area excluding the outer periphery and peripheral area of the substrate 1 as shown in FIG. 3(d).

A chromium film serving as a light-shielding layer 2 having an optical transmission of ten-odd percents is formed on the transparent film 3 serving as a phase shifter as shown in FIG. 3(e). A resist layer 7 is formed on the light-shielding layer 2 as shown in FIG. 3(f). The resist layer 7 is exposed image-wise to ionizing radiation 8 by using an electron beam exposure apparatus or the like as shown in FIG. 3(g), and then developed and rinsed to form a desired resist pattern 7p as shown in FIG. 3(h).

After heat and descum treatments are conducted when necessary, the light-shielding layer 2 which is exposed at the openings in the resist pattern 7p is dry-etched by using etching gas plasma 9 as shown in FIG. 3(i) to form a light-shielding pattern 2p as shown in FIG. 3(j). The transparent film 3k serving as a phase shifter formed in the pattern area, exposed at the openings in the resist pattern 7p is dry-etched by using etching gas plasma 9 as shown in FIG. 3(k) to form a phase shifter pattern 3p as shown in FIG. 3(l). The remaining resist is then removed, whereby an attenuated type phase shift photomask according to the present invention is completed as shown in FIG. 3(m).

In the above-described methods for producing the phase shift photomasks, the spin-on glass coated in the area excluding the photomask area where the glass will be a transparent film serving as a phase shifter, that is, the outer periphery and peripheral area of the substrate, is removed before it is baked. Therefore, a dust and the like which are usually made when the glass film formed in the above area cracks or peels off the substrate are not made. Thus, the number of defective photomasks to be produced is drastically decreased. Specific embodiments of the present invention are given below.

EXAMPLE 1

An alumina film serving as an etching stopper layer is formed on a quartz substrate. A chromium film serving as a light-shielding layer is formed on this etching stopper layer by a sputtering method. A resist "SAL 603" (manufactured by Shipley Co.) is spin-coated onto the light-shielding layer so that the thickness of the resist layer will be approximately 500 nm, and alignment is conducted by a conventional manner. The SAL 603 layer is subjected to image-wise exposure by using an electron beam exposure apparatus, and then developed and rinsed to form an SAL 603 resist pattern.

The chromium film which is exposed at the openings in the SAL 603 resist pattern is removed by reactive plasma etching using $CCl_4+O_2$, $CH_2Cl_2+O_2$, or the like.

The remaining resist is removed by oxygen plasma to obtain a chromium pattern.

Spin-on glass "Accuglass-211S" (manufactured by Allied Signal Inc.) is spin-coated onto the chromium pattern. After the resulting glass film is soft-baked, far ultraviolet light is applied to the film formed in the area excluding the outer periphery and peripheral area of the quartz substrate by using a mask aligner, a stepper or the like. Development is conducted by using methanol, and the spin-on glass deposited at the outer periphery and in the peripheral area of the substrate is removed by rinsing with pure water. The resultant is baked at 200° C. to 800° C. to form a transparent film serving as a phase shifter in a pattern area.

Next, a resist "SAL 603" (manufactured by Shipley Co.) is spin-coated onto the application glass film so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

After heat and descum treatments are conducted when necessary, the transparent film serving as a phase shifter formed in the pattern area, exposed at the openings in the SAL 603 resist pattern is removed by dry etching using $CF_4$, $C_2F_6$, $CHF_3$, $CHF_3+O_2$, or a mixture thereof to form a phase shifter pattern. The remaining resist pattern is then removed by ashing conducted by using oxygen plasma, whereby a Lebenson-type phase shift photomask with a shifter placed at the upper part thereof is completed. It is noted that the removal of the resist can also be made by a wet method using a resist-stripping solution, an acid or the like, instead of the dry etching method using oxygen plasma.

EXAMPLE 2

An alumina film serving as an etching stopper layer is formed on a quartz substrate. Spin-on glass "Accuglass-211S" (manufactured by Allied Signal Inc.) is spin-coated onto this alumina film. After the resulting glass film is soft-baked, far ultraviolet light is applied to the film formed in the area excluding the outer periphery and peripheral area of the quartz substrate by using a mask aligner, a stepper or the like. Development is conducted by using methyl alcohol, and the spin-on glass at the outer periphery and in the peripheral area of the substrate is removed by rinsing with pure water. The resultant is baked at 200° C. to 800° C. to form a transparent film serving as a phase shifter in a pattern area.

On this film, a chromium film serving as a light-shielding layer is formed by a sputtering method. A resist "SAL 603"(manufactured by Shipley Co.) is spin-coated onto the light-shielding layer so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

The chromium film which is exposed at the openings in the SAL 603 resist pattern is removed by reactive plasma etching using $CCl_4+O_2$, $CH_2Cl_2+O_2$ or the like.

The remaining resist is removed by oxygen plasma to form a chromium pattern. It is noted that the removal of the resist can also be made by a wet method using a resist-stripping solution, an acid or the like, instead of the dry etching method using oxygen plasma.

A resist "SAL 603" (manufactured by Shipley Co.) is spin-coated onto the chromium pattern so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

After heat and descum treatments are conducted when necessary, the transparent film serving as a phase shifter formed in the pattern area, exposed at the openings in the SAL 603 resist pattern is removed by dry etching using $CF_4$, $C_2F_6$, $CHF_3$, $CHF_3+O_2$, or a mixture thereof, and the remaining resist pattern is removed by ashing conducted by using oxygen plasma, whereby a Lebenson-type phase shift photomask with a shifter placed at the lower part thereof is completed. It is noted that the removal of the resist can also be made by a wet method using a resist-stripping solution, an acid or the like, instead of the dry etching method using oxygen plasma.

EXAMPLE 3

An alumina film serving as an etching stopper layer is formed on a quartz substrate. Spin-on glass "Accuglass-211S" (manufactured by Allied Signal Inc.) is spin-coated onto this alumina film. After the resulting glass film is soft-baked, far ultraviolet light is applied to the film formed in the area excluding the outer periphery and peripheral area of the quartz substrate by using a mask aligner, a stepper or the like. Development is conducted by using methyl alcohol, and the spin-on glass deposited at the outer periphery and in the peripheral area of the substrate is removed by rinsing with pure water. The resultant is baked at 200° C. to 800° C. to form a transparent film serving as a phase shifter in a pattern area.

On this film, a chromium film serving as a light-shielding layer is formed by a sputtering method so that the optical transmission of the layer will be from 1% to 50%. A resist "SAL 603" (manufactured by Shipley Co.) is spin-coated onto the light-shielding layer so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

The chromium film which is exposed at the openings in the SAL 603 resist pattern is removed by reactive plasma etching using $CCl_4+O_2$, $CH_2Cl_2+O_2$ or the like.

The remaining resist is removed by oxygen plasma to form a chromium pattern. It is noted that the removal of the resist can also be made by a wet method using a resist-stripping solution, an acid or the like, instead of the dry etching method using oxygen plasma.

After heat and descum treatments are conducted when necessary, the transparent film serving as a phase shifter formed in the pattern area, exposed at the openings in the SAL 603 resist pattern is removed by dry etching using $CF_4$, $C_2F_6$, $CHF_3$, $CHF_3+O_2$, or a mixture thereof, and the remaining resist pattern is removed by ashing conducted by using oxygen plasma, whereby an attenuated type phase shift photomask is completed. It is noted that the removal of the resist can also be made by a wet method using a resist-stripping solution, an acid or the like, instead of the dry etching method using oxygen plasma.

FIG. 4(a) to FIG. 4(f) show another example of the method for producing a phase shift photomask according to the present invention. In this method, a resist layer 2 of the photo-setting type or the like is firstly formed on a substrate 1 made of quartz or the like (hereinafter referred to as substrate) as shown in FIG. 4(a). An ordinary hardening-type resist can be used for forming the resist layer 2. However, it is necessary that the resist layer 2 can be dissolved in or swollen with an organic solvent.

Energy rays 10 are applied only to the edge portion of the resist layer 2 as shown in FIG. 4(b). The energy rays 10 are light to which the resist is sensitive, and, in general, light such as ultraviolet light or electron beam which can form a resist pattern by irradiation thereof and development subsequent to it is used.

After the resist layer 2 is irradiated with the energy rays 10, it is subject to an ordinary development treatment, and the non-edge portion of the resist layer 2 is removed to form a resist pattern 2p as shown in FIG. 4(c). Since this is conducted by an exposure method, good reproducibility with respect to an exposure region is obtained.

As shown in FIG. 4(d), SOG is coated and then baked, or deposited by sputtering to form a transparent film 3 serving as a phase shifter.

As shown in FIG. 4(e), the resist pattern 2p is brought into contact with a solution S in which the resist is dissolved or with which it is swollen. When the resist pattern 2p placed under the transparent film 3 serving as a phase shifter is dissolved or swollen, the transparent film 3 formed on the resist pattern 2p is removed.

By this process, a transparent film 3k serving as a phase shifter with the unnecessary portion of the transparent film 3 serving as a phase shifter removed is formed in a pattern area as shown in FIG. 4(f). In the above, in the case where the resist pattern 2p is not dissolved completely, it can be removed by an ashing treatment using plasma or the like.

The transparent film 3k serving as a phase shifter formed in the pattern area as shown in FIG. 4(f) can be formed at any proper stage either before or after the formation of the light-shielding pattern depending on the type of a phase shift photomask to be produced. Further, the shape and the area of the transparent film 3k can be freely selected on the basis of the range of the light-applying area to the resist layer 2.

A commercially available phase shift photomask blank takes, in general, the shape shown in FIG. 4(f).

In this method, the transparent film serving as a phase shifter formed in the area where the transparent film is unnecessary is removed through a highly-accurate unnecessary-area-resist pattern which is formed by exposure in advance, so that a dust and the like which are usually made when the transparent film formed in the unnecessary area cracks or peels off the substrate are not made. Thus, the number of defective photomasks to be produced is drastically decreased. In addition to this, it is not necessary to use a poison. A specific example of the method shown in FIG. 4(a) to FIG. 4(f) is given below.

EXAMPLE 4

An alumina film serving as an etching stopper layer is firstly formed on a quartz substrate of a phase shift photomask. A chromium film serving as a light-shielding layer is then formed on this etching stopper layer by a sputtering method. A resist "SAL 603" (manufactured by Shipley Co.) is spin-coated onto the light-shielding layer so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

The chromium film which is exposed at the openings in the SAL 603 resist pattern is removed by reactive plasma etching using $CCl_4+O_2$, $CH_2Cl_2+O_2$ or the like.

The remaining resist is removed by oxygen plasma to obtain a chromium pattern.

OMR manufactured by Tokyo Oka Kabushiki Kaisha, Japan, a photo-setting type resist, is dropped on the chromium pattern, and spread over the entire surface of the substrate by rotating the substrate at high speed, utilizing the centrifugal force, thereby obtaining a uniform resist layer. Ultraviolet light (436 nm) is applied to the outer periphery and peripheral area of the quartz substrate by using a mask aligner, a stepper or the like, and then development is conducted to form a resist pattern at the outer periphery of the substrate. SOG (OCD) manufactured by Tokyo Oka Kabushiki Kaisha, Japan is dropped on the substrate, and spread over the entire surface of the substrate by rotating the substrate at high speed. The SOG layer is then dried by evaporating any solvent contained therein.

When the resultant is baked, the protuberance formed at the edge surface of the substrate 1 cracks or peels off the substrate. When an organic solvent of ketones is dropped on the protuberance under this condition, the solvent spreads along the cracks and reaches to the resist pattern provided under the SOG layer. The resist pattern is thus dissolved. At this time, the SOG at the edge surface of the substrate is hollow, so that it can be removed by the centrifugal force when the substrate is rotated at high speed by a spinner while the organic solvent is dropped. The SOG itself after being baked is not adversely affected by an organic solvent of ketones.

It is noted that a photomask in this shape can be supplied to a market as an alternating type phase shift photomask with a shifter placed at the upper part thereof.

A resist "SAL 603" (manufactured by Shipley Co.) is spin-coated onto the spin-on glass layer so that the thickness of the resist layer will be approximately 500 nm, and alignment is conducted by a conventional manner. The SAL 603 resist layer is subjected to image-wise exposure by using an electron beam exposure apparatus, and then developed and rinsed to form an SAL 603 resist pattern.

After heat and descum treatments are conducted when necessary, the transparent film serving as a phase shifter formed in a pattern area, exposed at the openings in the SAL 603 resist pattern is removed by dry etching using $CF_4$, $C_2F_6$, $CHF_3$, $CHF_3+O_2$, or a mixture thereof to form a phase shifter pattern. The remaining resist pattern is then removed by ashing conducted by using oxygen plasma, whereby an alternating type phase shift photomask with a shifter placed at the upper part thereof is completed. It is noted that the removal of the resist can also be conducted by a wet method using a resist-stripping solution, an acid or the like, instead of the dry etching method using oxygen plasma.

What is claimed is:

1. A method for producing a phase shift photomask comprising the steps of:

coating a transparent film serving as a phase shifter onto a substrate;

solidifying the transparent film in a photomask-pattern-forming area excluding a peripheral area of the substrate, while leaving the transparent film in the area excluding the photomask-pattern-forming area unsolidified; and removing the unsolidified transparent film by etching in order to leave the solidified transparent film only in the photomask-pattern-forming area.

2. A method for producing a phase shift photomask as set forth in claim 1, wherein the transparent film serving as a phase shifter is formed by using a spin-on glass.

3. A method for producing a phase shift photomask as set forth in claim 1, wherein the transparent film serving as a phase shifter is solidified by irradiation of energy rays conducted through a light-shielding film.

4. A method for producing a phase shift photomask as set forth in claim 3, wherein the energy rays are ultraviolet rays.

5. A method for producing a phase shift photomask as set forth in claim 3, wherein the energy rays are X-rays.

6. A method for producing a phase shift photomask as set forth in claim 1, wherein the unsolidified transparent film is etched by using an organic solvent.

7. A method for producing a phase shift photomask as set forth in claim 1, wherein after a light-shielding pattern is formed on the substrate, the transparent film serving as a phase shifter is coated onto the substrate through the light-shielding pattern.

8. A method for producing a phase shift photomask as set forth in claim 7, wherein the solidified transparent film remaining in the photomask-pattern-forming area is made into a phase shifter pattern.

9. A method for producing a phase shift photomask as set forth in claim 1, wherein the transparent film serving as a phase shifter is directly coated onto the substrate.

10. A method for producing a phase shift photomask as set forth in claim 9, wherein a light-shielding film is provided on the substrate so as to cover the solidified transparent film remaining in the photomask-pattern-forming area, and made into a light-shielding pattern; and the solidified transparent film is made into a phase shifter pattern through the light-shielding pattern.

11. A method for producing a phase shift photomask comprising the steps of:

forming a resist layer on a substrate;

leaving the resist layer only in a peripheral area of the substrate;

providing a transparent film serving as a phase shifter on both the remaining resist layer and the surface of the substrate; and removing the remaining resist layer together with the transparent film formed thereon by applying a solvent to the remaining resist layer in order to leave the transparent film only in a photomask-pattern-forming area excluding the peripheral area of the substrate.

12. A method for producing a phase shift photomask as set forth in claim 11, wherein the resist layer in the peripheral area of the substrate is irradiated with energy rays and then developed in order to leave the resist layer in this area.

13. A phase shift photomask comprising:

a substrate having a peripheral area along an outer peripheral edge thereof;

a light-shielding pattern formed on the substrate and including a photomask pattern-forming area; and a phase shifter pattern formed on both the substrate and the light-shielding pattern, said phase shifter pattern being provided in an area including said photomask pattern-forming area and excluding said peripheral area.

14. A phase shift photomask blank comprising:

a substrate having a peripheral area along an outer peripheral edge thereof; and a transparent film serving as a phase shifter and formed on the substrate, said transparent film being provided in an area excluding said peripheral area.

* * * * *